US012587212B2

(12) United States Patent
Scobbie et al.

(10) Patent No.: US 12,587,212 B2
(45) Date of Patent: Mar. 24, 2026

(54) MULTIPART NUMERICAL ENCODING

(71) Applicant: UNTETHER AI CORPORATION, Toronto (CA)

(72) Inventors: Jonathan Andrew Scobbie, Toronto (CA); Andrew Vincent Rock, Toronto (CA)

(73) Assignee: UNTETHER AI CORPORATION, Toronto (CA)

( * ) Notice: Subject to any disclaimer, the term of this patent is extended or adjusted under 35 U.S.C. 154(b) by 121 days.

(21) Appl. No.: 18/675,877

(22) Filed: May 28, 2024

(65) Prior Publication Data

US 2025/0373268 A1 Dec. 4, 2025

(51) Int. Cl.
*H03M 7/30* (2006.01)
*H03M 7/32* (2006.01)
(52) U.S. Cl.
CPC ....... *H03M 7/6047* (2013.01); *H03M 7/3002* (2013.01)
(58) Field of Classification Search
CPC .......................... H03M 7/6047; H03M 7/3002
USPC ............................................... 341/50, 76, 87
See application file for complete search history.

(56) References Cited

U.S. PATENT DOCUMENTS

| | | | |
|---|---|---|---|
| 7,317,407 B2 * | 1/2008 | Moriya | H03M 7/24 |
| | | | 341/51 |
| 9,298,457 B2 * | 3/2016 | Wegener | G06F 9/3001 |

* cited by examiner

*Primary Examiner* — Khai M Nguyen
(74) *Attorney, Agent, or Firm* — Perry + Currier Inc.

(57) ABSTRACT

A multipart encoded representation or data type may be particularly useful for limited-capacity processors, such as those used in at-memory or single-instruction, multiple data (SIMD) devices. To encode a source number, the source number is quantized as a first binary representation defined by a first set of exponent bits and a first set of mantissa bits to obtain a first encoded part. A difference between the source number and a nearest dequantization of the first encoded part is computed. The difference is quantized as a second binary representation defined by a second set of exponent bits and a second set of mantissa bits to obtain a second encoded part. The first encoded part and the second encoded part are stored as an encoded representation of the source number. A computational operation may be performed using the encoded representation. The encoded representation may be decoded using an inverse process.

23 Claims, 6 Drawing Sheets

MULTIPART NUMERICAL ENCODING

BACKGROUND

In computing devices, there is often a tradeoff between simplicity and precision. Simple systems tend to provide relatively high computational throughput. Precision tends to demand hardware complexity or time, which can reduce computational throughput. Efficiency is also a concern as, for example, complex systems often demand great operational power.

This problem can arise when selecting data types for a program. A data type with high precision, such as a large range or greater bit-length, will often require greater complexity in the form of more memory to store or more processing cycles when performing operations. Software developers often consider this tradeoff when selecting data types.

DETAILED DESCRIPTION

Disclosed herein are data types (encoded representations), related methods, and devices operable with same. The techniques provided herein aim to improve the tradeoff between simplicity and precision. The techniques provided herein are particularly suited for an at-memory or single-instruction, multiple data (SIMD) hardware architecture, in which each of a multitude of individual processing elements is highly simplified and optimized. Rather than supporting large data types to improve precision, this disclosure provides smaller, combinable data types that allow the tailoring of precision to specific needs. Software developers are thus provided with more tools to better mitigate the negative effects of the tradeoff.

Figure 1:
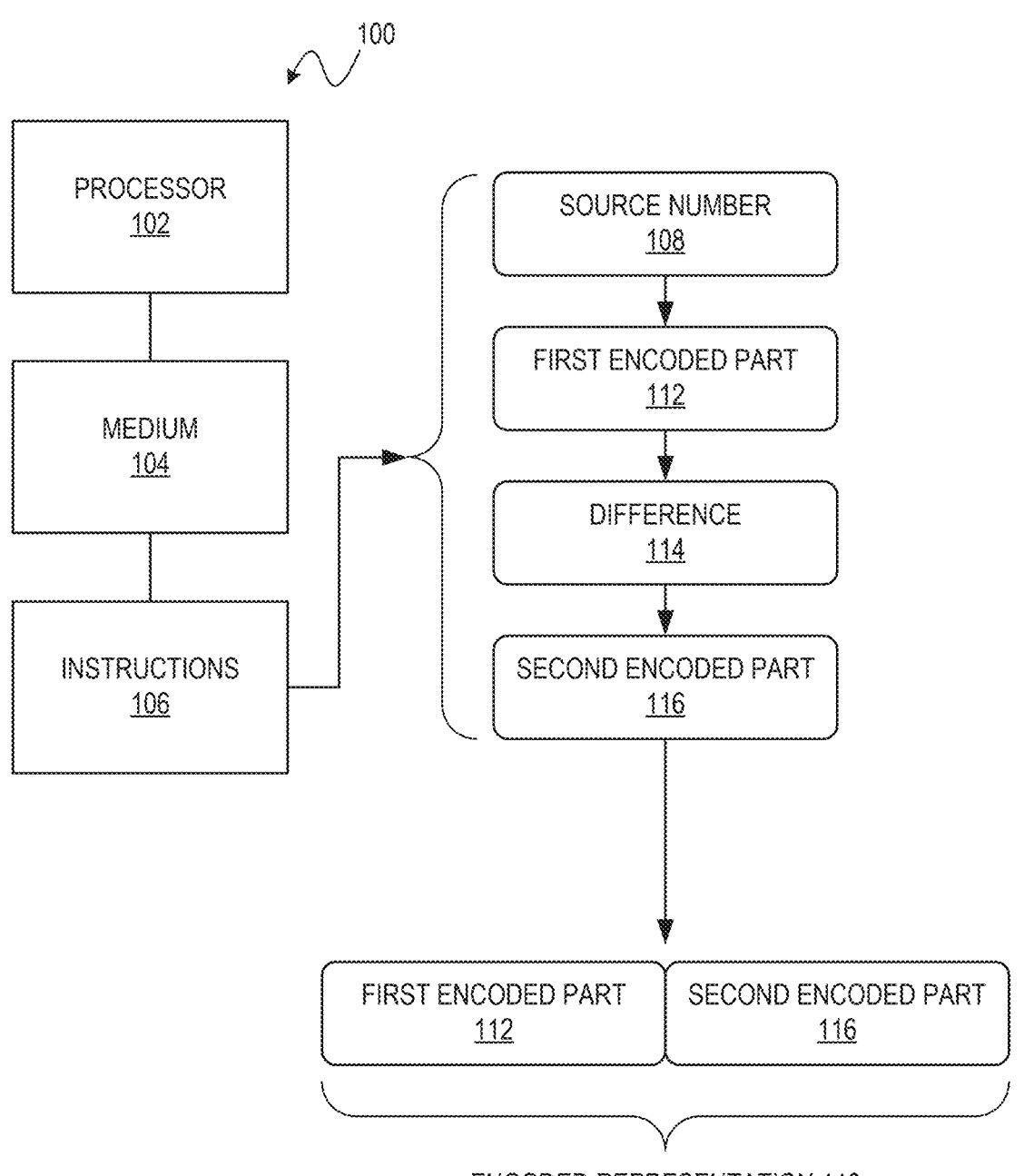
FIG. 1 is a block diagram of an example computing device configured to encode a source number into a multipart encoded representation and likewise decode the multipart encoded representation.

FIG. 1 shows an example computing device 100. The device 100 includes one or more processors 102, non-transitory machine readable medium 104, and instructions 106. The device 100 is configured to encode a source number 108 into a multipart encoded representation 110 and likewise decode the multipart encoded representation 110.

The device 100, or another device, may be configured to perform a computation using the multipart encoded representation 110.

The one or more processors 102 (generally "processor") may include an array of SIMD processing elements, a microcontroller, a central processing unit (CPU), a field-programmable gate array (FPGA), an application-specific integrated circuit (ASIC), or a combination of such. The processor 102 cooperates with the medium 104 and may also include or cooperate with volatile memory, such as a random-access memory (RAM), to execute instructions 106.

The non-transitory machine-readable medium 104 may include an electronic, magnetic, optical, or other type of non-volatile physical storage device that encodes the instructions 106 that implement the functionality discussed herein. Examples of such storage devices include read-only memory (ROM), electrically-erasable programmable read-only memory (EEPROM), flash memory, a solid-state drive (SSD), a hard drive (HD), or a combination of such.

The instructions 106 may be directly executed, such as binary or machine code, and/or may include interpretable code, bytecode, source code, or similar instructions that may undergo additional processing to be executed. All of such examples may be considered executable instructions.

The computing device 100 may be configured to convert a source number 108, such as a real number that is represented as a floating-point number, to a multipart encoded representation 110, of which each part is a floating-point number. The computing device 100 may be configured to convert a multipart encoded representation 110 to a source number 108. In various examples, the computing device 100 is configured to perform both encoding and decoding. In other examples, a computing device 100 may be configured to perform one of encoding and decoding. The needs of a particular implementation may determine the encoding/decoding functionality provided.

It should be noted that, while the examples herein discuss multipart encoded representations with two parts, the techniques described herein are readily applicable to three, four, or more parts. Any practical number of parts may be used in various implementations, as would be readily understood by the person of ordinary skill in the art given the benefit of this disclosure. Accordingly, when terms such as "two" or "both" are used in the description and claims with reference to encoded or decoded parts, it should be kept in mind that two or more of such parts may be used.

With regard to encoding, the processor 102, as configured by the instructions 106, quantizes the source number 108 as a first encoded part 112. It is expected that the quantization likely leaves a remainder that could otherwise be lost. Rounding or truncation is used to obtain a suitable quantization for the first encoded part 112. The processor 102 computes this remainder or difference 114 between the source number 108 and a dequantization of the first encoded part 112. To do this, the first encoded 112 part may be dequantized and the difference 114 with the source number 108 may be computed by subtraction.

The processor 102 is further configured to quantize the difference 114 as a second encoded part 116. Quantization of the second encoded part 116 uses a higher-precision but smaller scale than quantization of the first encoded part 112, so that the difference 114, which is the non-quantized remainder from the first quantization, is suitably quantized.

The scale and precision of the encoded parts 112, 114 may be defined by respective sets of exponent and mantissa bits, as well as an exponent bias, as will be discussed in detail below.

The processor 102 may repeat the above process and compute a second difference between the first difference 114 and a nearest dequantization of the second encoded part 116, and then quantize the second difference to generate a third encoded part, and so on.

The processor 102 is configured to then store the first encoded part 112 and the second encoded part 116 (and the third encoded part, and so on, if used) as a multipart encoded representation 110 of the source number 108.

The processor 102 may then perform a computational operation using the multipart encoded representation 110. Example operations include addition, multiplication, and multiply-accumulate operation.

Regarding decoding a multipart encoded representation 110, which may represent a resultant of a computational operation, this may include the processor 102 performing the inverse of the above functions. This may include identifying first and second encoded parts 112, 116 in the multipart encoded representation 110, dequantizing the encoded parts 112, 116, and adding the dequantized values together to obtained a decoded number. Decoding is discussed further below.

Figure 2:
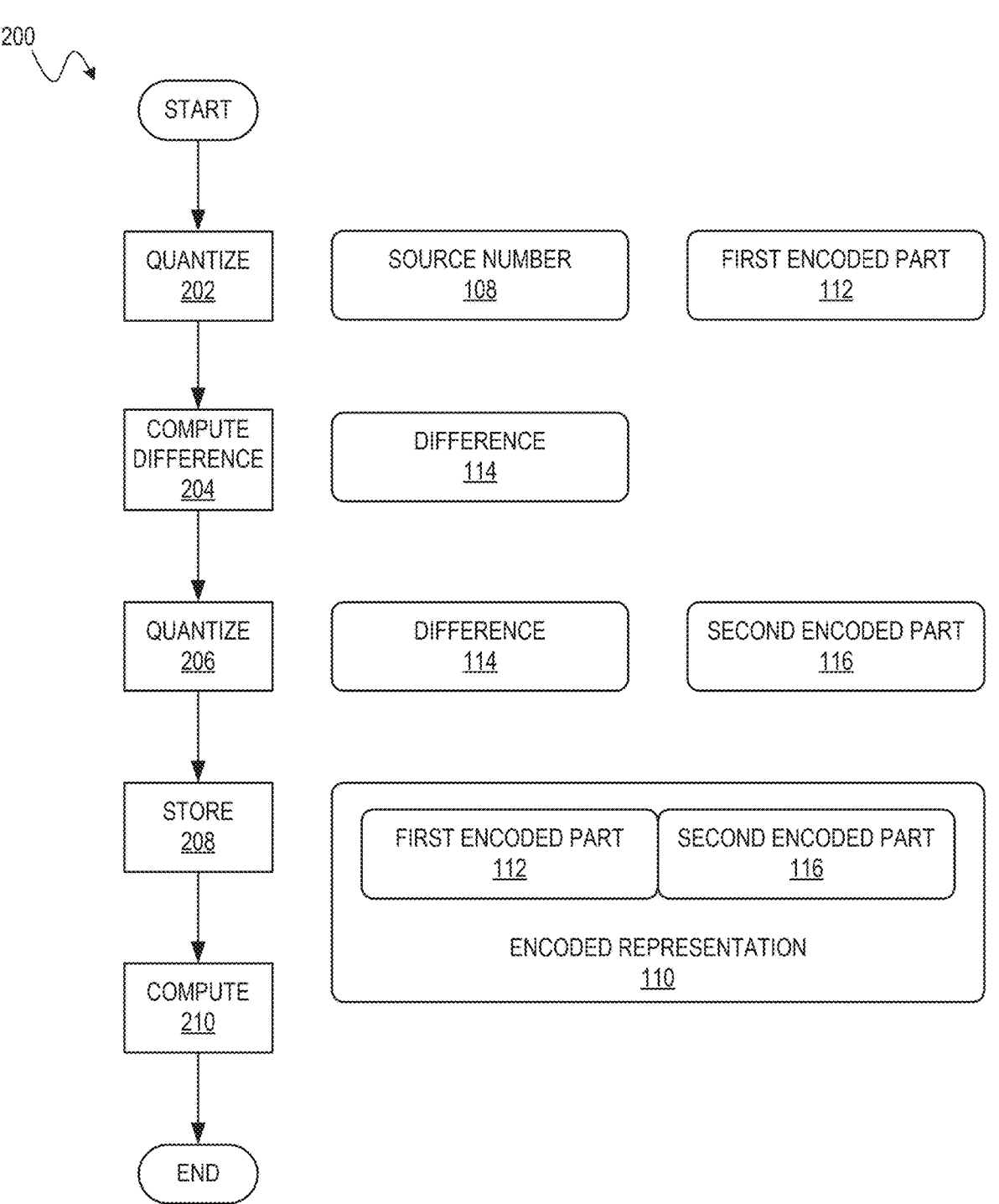
FIG. 2 is a flowchart of a process to encode a source number into a multipart encoded representation.

FIG. 2 shows a method 200 of encoding a source number 108 into a multipart encoded representation 110. The method 200 may be implemented as instructions that may be executed by one or more processors operating collectively, such as processor 102 discussed above.

At block 202, a source number 108 is encoded as a first binary representation defined by a first set of exponent bits, a first set of mantissa bits, and a first exponent bias to obtain a first encoded part 112. The first binary representation may also include a first sign bit.

Bias is a tunable value that is subtracted from the exponent. This allows scaling (by powers of 2) the range of values represented by a binary representation.

Thus, a binary representation may be defined as a tuple $P=(s, e, m, b)$ of quantization parameters: s: sign, e: exponent, m: mantissa, and b: bias. Quantized values are thus $q \in Q_P = \{0, \ldots, 2^{s+e+m}-1\}$.

At block 204, the first encoded part 112 is dequantized to the nearest value, and the difference 114 between the source number 108 and the dequantization of the first encoded part 112 is computed.

Dequantization of a value q to a real value $r \in R_P$, which is represented as a floating-point number in a computing device, may be performed with the following dequantize function (Python):

```
def dequantize(q: Q_P) -> R_P:
    # extract bits from quantized float
    sign = (q >> e >> m) & s
    expo = (q >> m) & ((1 << e) - 1)
    mant = (q >> 0) & ((1 << m) - 1)
    # decode sign
    sign = -1 if sign == 1 else +1
    if expo == 0:
        # subnormal case: exponent becomes 1
        expo = 1
    else:
        # normal case: append leading 1 to mantissa
        mant |= 1 << m
    # dequantize to float
    return sign * mant * 2 ** (expo - b)
```

At block 206, the difference 114 is quantized as a second binary representation defined by a second set of exponent bits, a second set of mantissa bits, and a second exponent bias to obtain a second encoded part 116. The second exponent bias is selected based on a gap, such as a maximum gap, between quantized values of the first binary representation. The second binary representation may also include a second sign bit.

The number of bits used for the first and second exponents may be equal or different. Likewise, the number of bits used for the first and second mantissas may be equal or different. The quantities of the first and second exponent bits and the first and second mantissa bits may be selected according to implementation needs.

At block 208, the first encoded part 112 and the second encoded part 116 are stored as an encoded representation 110 of the source number 108.

At block 210, a computational operation, such as an addition, multiplication, or multiply-accumulate, is performed using the encoded representation 110.

Figure 3:
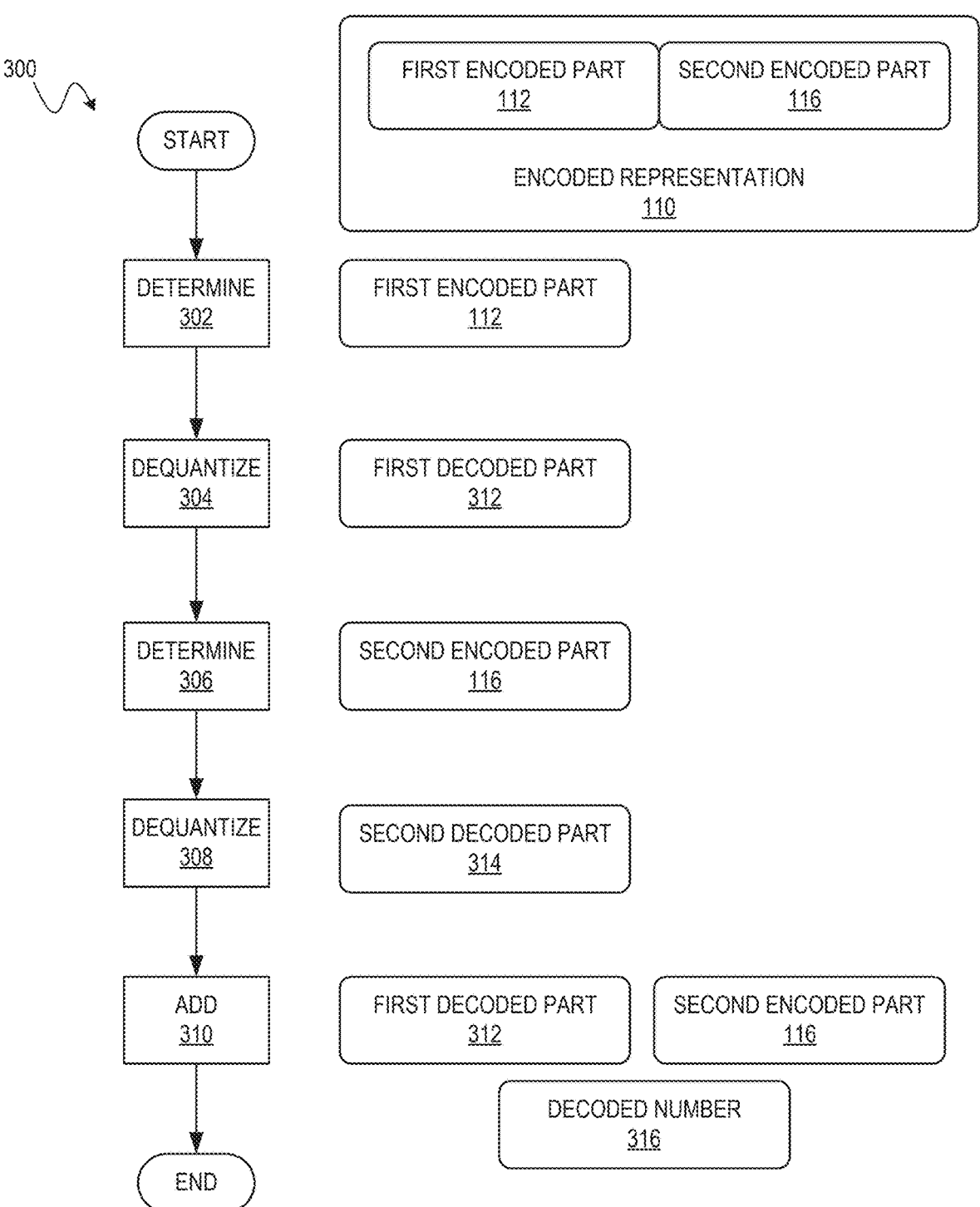
FIG. 3 is a flowchart of a process to decode a multipart encoded representation into a decoded number.

FIG. 3 shows a method 300 decoding a multipart encoded representation 110 to obtain a decoded number 316. This is the inverse of the encoding operation of FIG. 2. The method 300 may be implemented as instructions that may be executed by one or more processors operating collectively, such as processor 102 discussed above.

At block 302, a first encoded part 112 of an encoded representation 110 of a source number 108 (FIG. 1) is determined. This may include identifying a subsequence of bits in the sequence of bits of the encoded representation 110 with reference to a first binary representation (number of exponent bits, mantissa bits, etc.) used for the first encoded part 112.

At block 304, the first encoded part 112 is dequantized based on the first binary representation defined by a first sign bit (if used), a first set of exponent bits, a first set of mantissa bits, and a first bias to obtain a first decoded part 312.

At block 306, a second encoded part 116 of the encoded representation 110 of the source number 108 (FIG. 1) is determined. This may include identifying a subsequence of bits in the sequence of bits of the encoded representation 110 with reference to a second binary representation (number of exponent bits, mantissa bits, etc.) used for the second encoded part 116.

At block 308, the second encoded part 116 is dequantized based on the second binary representation defined by a second sign bit (if used), a second set of exponent bits, a second set of mantissa bits, and a second bias to obtain a second decoded part 314.

At block 310, the second decoded part 314 and the first decoded part 312 are combined, i.e., added, to obtain a decoded number 316.

Figures 4, 5, 6:
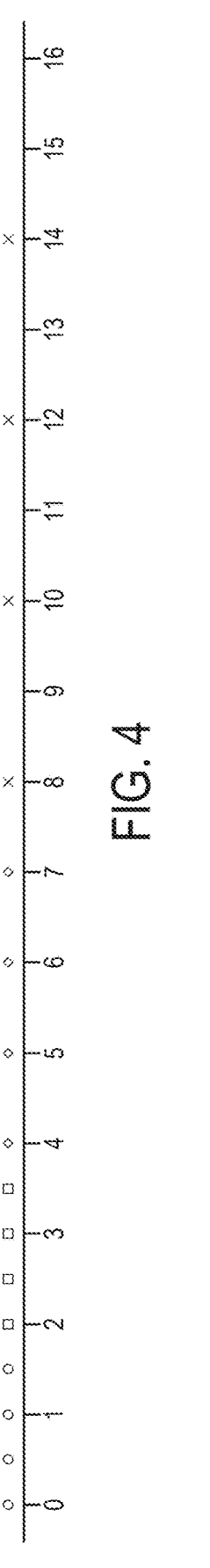
FIG. 4 is a plot of an example binary representation of a quantization parameter set.
FIG. 5 is a plot of an example unsigned dual representation with a pair of quantization parameter sets.
FIG. 6 is a plot of an example signed dual representation with a pair of quantization parameter sets.

FIG. 4 shows an example of dequantized real numbers $R_P$ with quantization parameters $P=(0,2,2,2)$, that is, a positive or absent sign bit, two exponent bits, two mantissa bits, and an exponent bias value of two.

The quantized real numbers $R_P$ can be partitioned into sets $L_k$ ($0 \le k < 2^e$), each of which contains the elements with exponent equal to k. Each such set has been assigned a symbol in the figure (circle, square, diamond, and X). It should be apparent that density doubles as $k \to 0$, with the exception of the $k=0$ case, which are the subnormals that linearly span the gap between 0 and the smallest normal number.

Quantizing a real number r may be performed by inverting the dequantize function (above). This may be done by rounding, i.e., a process equivalent to selecting $q \in Q_P$ such that $|r\text{-dequantize }(q)|$ is minimized.

FIG. 5 shows an example unsigned dual representation with a pair of quantization parameter sets.

With a first binary representation defined by quantization parameters $P_0=(s_0, e_0, m_0, b_0)$, gaps between real values $R_{P_0}$ can be filled with a second binary representation defined by quantization parameters $P_1=(s_1, e_1, m_1, b_1)$. After computing the first binary representation $q_0=\text{quantize}_0(r_0)$, where $r_0$ is the source number being encoded, the remainder (difference) is computed as $r_1=r_0-\text{dequantize}_0(q_0)$. The second binary representation may be computed as $q_1=\text{quantize}_1(r_1)$. The result is a multipart (e.g., dual) encoded representation or multipart (e.g., dual) datatype $D=(P_0, P_1)=((s_0, e_0, m_0, b_0), (s_1, e_1, m_1, b_1))$ with an approximation error that is reduced from $|r_1|$ to $|r_1-\text{dequantize}_1(q_1)|$.

Sets of useful quantization parameters $(P_0, P_1)$ may be predetermined based on operational needs.

In the example shown in FIG. 5, the sign bits of the quantization parameters are the same, $s_0=s_1=0$. Remainders are limited to be positive, such that $r_1 \geq 0 \Rightarrow r_0 \geq \text{dequantize}_0$ $(q_0)$, so $\text{dequantize}_0$ rounds towards zero. The maximum value of remainder $r_1$ is equal to the maximum gap $G_0=2^{2^{e_0}-1-b_0}$. The quantization parameters $P_1$ may be selected to yield equal spacing up to this value, which means $2^{m_1+2^{e_1}-b_1}=2^{e_0-1-b_0} \Rightarrow m_1+2^{e_1}-b_1=2^{e_0}-1-b_0 \Rightarrow b_1=b_0+(2^{e_1}-2^{e_0})+(m_1+1)$.

With a first binary representation defined by quantization parameters $P=(0,2,2,2)$, a second binary representation may be defined by quantization parameters $(0,2,2, b_1)$ with a bias $b_1=2+(2^2-2^2)+(2+1)=5$. This leads to the dual representation shown in FIG. 5, where any point from the second binary representation 502 can be combined with any point from the first binary representation 500. For instance, a first value 504 of 5 of the first binary representation 500 is combined with a second value 506 of 0.1875 of the second binary representation 502 to arrive at a combined value of 5.1875, which cannot be expressed by either representation 500, 502 alone.

FIG. 6 shows an example signed dual representation with a pair of quantization parameter sets.

A signed dual representation may be a symmetrical version of the unsigned case (FIG. 5). This may be achieved by round towards zero when quantizing the first binary representation $q_0$. In this case, the sign of the remainder $r_1$ will be the same as the sign of the number being encoded $r_0$.

More efficient use of the second binary representation $q_1$ may be realized by using a round-to-nearest operation for the first quantization $\text{quantize}_0$. Thus, instead of the remainder $r_1$ being limited to a positive gap, i.e., $0 \leq r_1 < G_0$, when the source number $r_0$ is positive and being limited to a corresponding negative gap when the source number $r_0$ is negative, the remainder $r_1$ is limited to positive and negative values spanning an equivalent gap, i.e., $$-\frac{G_0}{2} \leq r_1 \leq +\frac{G_0}{2}.$$

The sign of the remainder $r_1$ (and its quantized value $q_1$) is thus independent of the sign of the source number being encoded $r_0$ (and its quantized value $q_0$).

In addition, when allowing for positive and negative remainders, the value of the remainder $r_1$ is capped at half the size at it would be for only positive (or negative) values. Accordingly, the range of $P_1$ may be reduced by a factor of two. This may be effected by a suitable selection of the bias for the second quantization, i.e., $b_1=b_0+(2^{e_1}-2^{e_0})+(m_1+1)+1$. This results in the representation shown in FIG. 5. As can be seen, the values of the second representation 602 extend in both the positive and negative directions from each value of the first representation 600. A first value 604 of 8 of the first binary representation 600 is combined with a second value 606 of 0.75 of the second binary representation 602 to arrive at a combined value of 8.75, which cannot be expressed by either representation 600, 602 alone. Given that both positive and negative values are encoded in this example, there are also values of 7.25, −8.75, and −7.25 obtained from the other positive and negative combinations of these particular absolute values (8 and 0.75).

Figure 7:
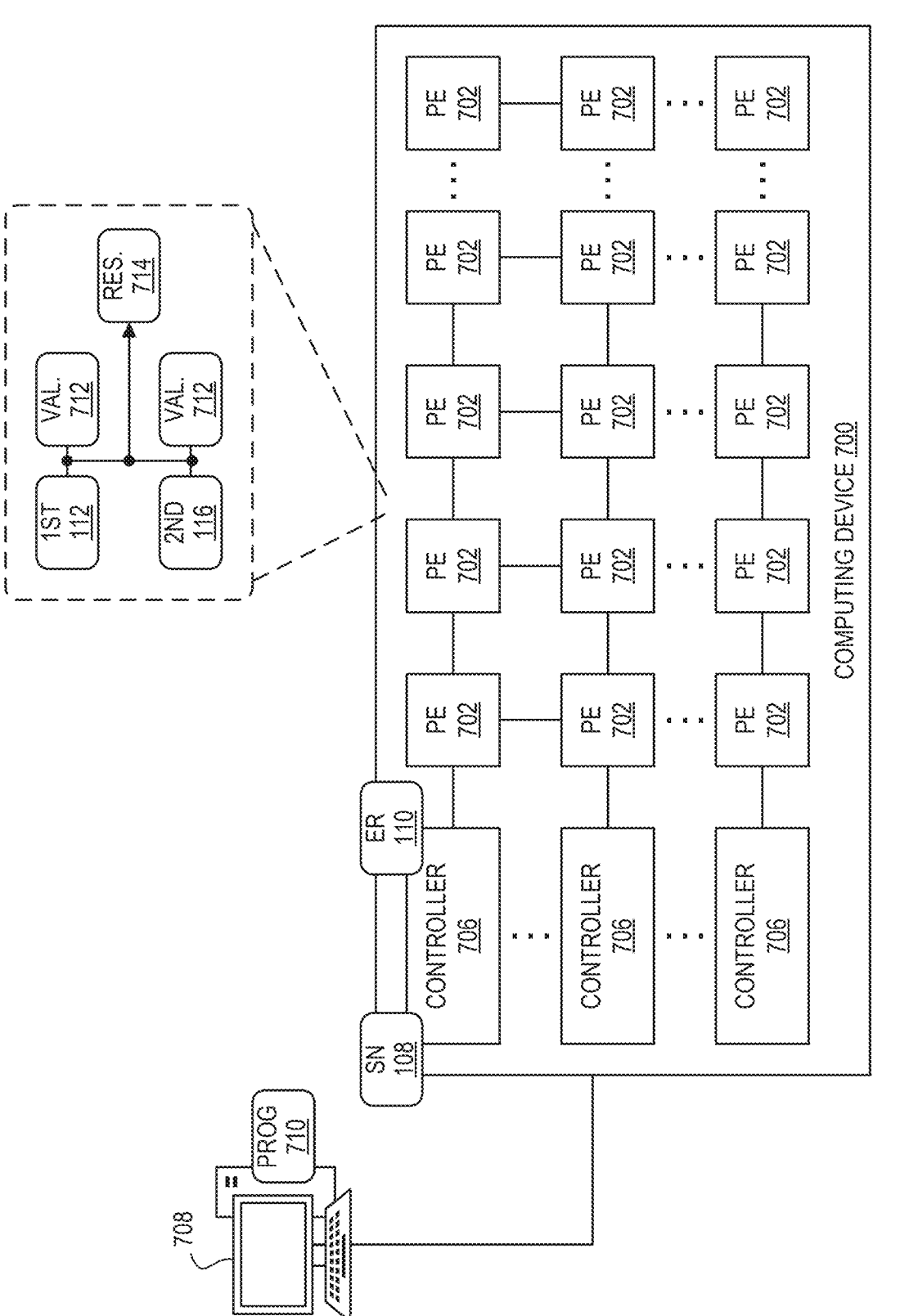
FIG. 7 is a block diagram of another example computing device configured to encode a source number into a multipart encoded representation and likewise decode the multipart encoded representation.

FIG. 7 shows an example computing device 700 configured to encode a source number into a multipart encoded representation and likewise decode the multipart encoded representation to obtain a decoded number. The computing device 700 is a SIMD device, which may be termed an at-memory computing device. U.S. Pat. No. 11,881,872, which is incorporated herein by reference, may be referenced for additional details concerning devices that may be used or adapted to be used as the device 700.

The computing device 700 includes an array of processing elements or PEs 702. Processing elements 702 may be logically and, optionally, physically arranged in a two-dimensional array. Such an array may be considered to have rows and columns.

Each processing element 702 includes registers, an arithmetic logic unit (ALU), and other circuitry configured to perform computational operations.

Each processing element 702 includes or is connected to working memory dedicated to that processing element 702. A processing element 702 may be connected with one or more neighboring processing elements 702 to share information. Processing element interconnections may be provided in the row direction, the column direction, or both.

The computing device 700 further includes a controller 706 connected to a subset of processing elements 702 (e.g., a row or column of PEs). The controller 706 controls the connected processing elements 702 to perform the same operation on data contained in each processing element 702. The controller 706 may further control loading/retrieving of data to/from the processing elements 702, control the communication among processing elements 702, and/or control other functions for the processing elements 702. Any suitable number of controllers 706 may be provided to control the processing elements 702. Controllers 706 may be connected to each other for mutual communications.

The computing device 700 may further include a bus for communications among the controllers 706 and/or processing elements 702, direct memory access hardware to share information between memory of the processing elements, and other components (not shown).

The computing device 700 may be connected to a host system 708 that provides a program 710 to the computing device 700 and that expects output of the program during and/or after execution by the computing device 700. Such connection may be between the host system 708 and the controller(s) 706. The host system 708 may also provide a user interface and other components to support operations of the computing device 700. The host system 708 may be a conventional computing device, such as a desktop/notebook computer, server, smartphone, or vehicle-based computer.

The controller 706 is a processor (e.g., microcontroller, etc., see above) that may be configured with instructions to control the processing elements 702 to operate with encoded representations of numbers, as discussed above.

The controller 706 loads one or more processing elements 702 with an encoded representation 110 of a source number 108. The encoded representation 110 is defined as discussed above. The encoded representation 110 may be loaded into a single processing element 702 (see FIG. 8) or may be split among multiple processing elements 702 (see FIG. 9), depending on the configuration of the processing elements 702, the size of the encoded representation 110, and implementation needs. If the encoded representation 110 is split, different encoded parts 112, 116 may be loaded into different processing elements 702.

Prior to loading an encoded representation 110 into a processing element 702, the controller 706 may compute the encoded representation 110 by performing a first quantization on the source number 108 to obtain a first part 112 and by performing a second quantization on a remainder of the first quantization to obtain a second part 116, as discussed above. Alternatively, the host system 708 may be configured to compute the encoded representation 110 from the source number 108.

The controller 706 controls the processing element 702 to perform a computational operation using the encoded representation 110. Example operations include addition, multiplication, and a multiply-accumulate operation. For instance, the controller 706 may command the processing element to perform a first multiplication with the first encoded part 112 and a value 712 and perform a second multiplication with the second encoded part 116 and the value 712. The results of the first and second multiplications may be combined (e.g., added) to obtain a total result 714.

The result 714 may be an intermediate result of a multiply-accumulate operation. The multiplication process mentioned above may be repeated with first and second parts 112, 116 of the intermediate result 714 being multiplied by another value 712 to obtain another result 714, which may be yet another intermediate result 714, in which case another value 712 is used for another multiplication, or a final result 714.

The controller 706 may output a result 714 of the computational operation. Output may be fed back into the computing device 700 and/or provided to the host 708 as, for example, output of the program 710.

Prior to outputting the result 714, the controller 706 may decode the result 714 (see FIG. 3). Alternatively, the host system 708 may decode the result 714.

The controller 706 may perform or facilitate the above operations simultaneously or near simultaneously with a multitude of the processing elements 702.

In summary, depending on implementation needs, the domain of multipart encoded representations 110 may be a) all of the host 708, the controllers 706, and the processing elements 702, where the host 708 converts between the encoded representation 110 and other data types; b) the controllers 706 and the processing elements 702, where the controllers 706 convert between the encoded representation 110 and other data types; or c) only the processing elements 702, which convert between the encoded representation 110 and other data types.

Figure 8:
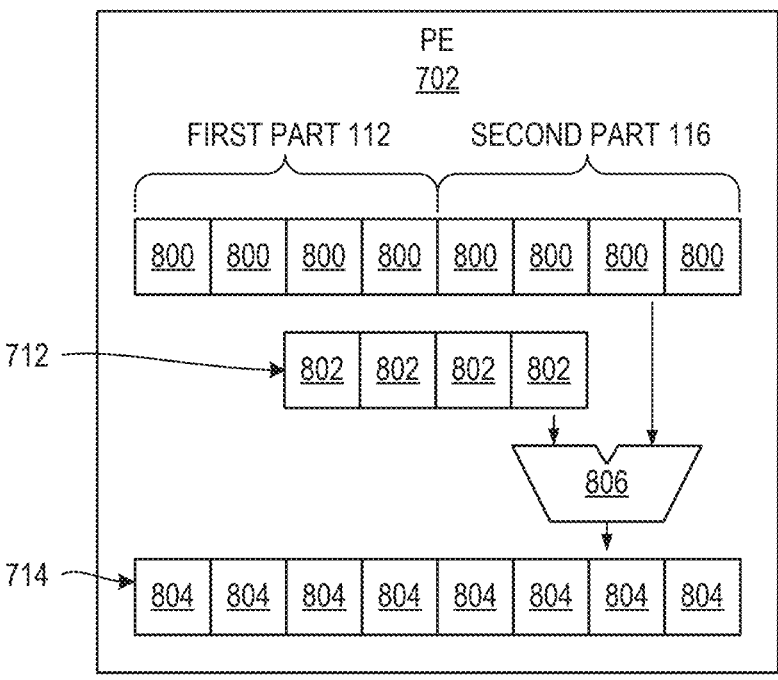
FIG. 8 is a block diagram of an example processing element of FIG. 7 performing an operation with both parts of an encoded representation.

FIG. 8 shows a processing element 702 (FIG. 7) performing an operation with both parts 112, 116 of an encoded representation. The processing element 702 includes storage elements 800, 802, 804, such as registers and/or memory cells, to store the parts 112, 116 of an encoded representation, a value 712, and a result 714. The value 712 and result 714 may also conform to the schema of the encoded representation. The processing element 702 includes an ALU 806 configured to perform a desired operation with the parts 112, 116 of an encoded representation and the value 712 as operands to obtain the result 714.

Figure 9:
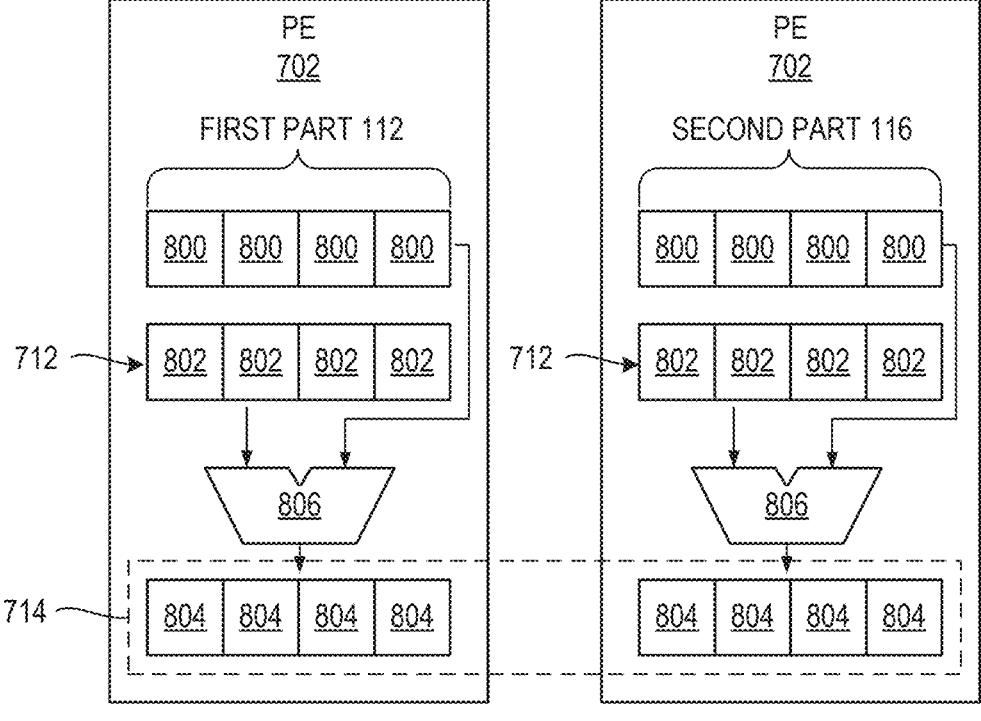
FIG. 9 is a block diagram of a pair of example processing elements of FIG. 7 performing an operation with separate parts of an encoded representation.

FIG. 9 shows a pair of example processing elements 702 (FIG. 7) performing an operation with separate parts 112, 116 of an encoded representation. This example is similar to the example of FIG. 8 and only differences will be discussed in detail. Each processing element 702 performs an operation with one part 112, 116 of the encoded representation and a value 712 as operands. The respective results may be added to arrive at the intended result 714. In this example, ALU 806 performs multiplication. In other examples, ALU 806 performs another operation, such as dequantization or multiplying accumulation. As should be apparent to those of ordinary skill in the art, the example of FIG. 9 demonstrates an improvement in the tradeoff between simplicity and precision.

Regarding dynamic range of the techniques discussed herein, if $D = (P_0, P_1) = ((s_0, e_0, m_0, b_0), (s_1, e_1, m_1, b_1))$ defines a dual data type as discussed herein and it is assumed that $P_1$ has at least as much dynamic range as $P_0$, then the maximum value of the dual data type is simply the sum of the maximum values of its constituents, i.e.:

$$HI_D = HI_0 + HI_1 =$$

$$\left(2^{m_0+1} - 1\right)\left(2^{2^{e_0}-1-b_0}\right) + \left(2^{m_1+1} - 1\right)\left(2^{2^{e_1}-1-b_1}\right) =$$

$$\left(2^{m_0+1} - 1\right)\left(2^{2^{e_0}-1-b_0}\right) + \left(2^{m_1+1} - 1\right)\left(2^{2^{e_0}-1-b_0}\right)\left(2^{-(m_1+2)}\right) =$$

$$\left(2^{m_0+1} - 1\right)\left(2^{2^{e_0}-1-b_0}\right) + \left(2^{-1} - 2^{-(m_1+2)}\right)\left(2^{2^{e_0}-1-b_0}\right) =$$

$$\left(2^{m_0+1} - 2^{-(m_1+2)} - 2^{-1}\right)\left(2^{2^{e_0}-1-b_0}\right) \approx 2^{m_0+2^{e_0}-b_0}$$

The minimum positive value of a dual data type is the minimum of the minimum positive values of its constituents. By assumption, this is the second one, i.e., $LO_D = LO_1 = 2^{1-b_1} = 2^{-(b_0+(2^{e_1}-2^{e_0})+m_1+1)}$.

Then, the dynamic range is $$DR_D =$$

$$lg\left(\frac{HI_D}{LO_D}\right) = lg(HI_D) - lg(LO_D) \approx$$

$$lg\left(2^{m_0+2^{e_0}-b_0}\right) - lg\left(2^{-(b_0+(2^{e_1}-2^{e_0})+m_1+1)}\right) =$$

$$(m_0 + 2^{e_0} - b_0) + (b_0 + (2^{e_1} - 2^{e_0}) + m_1 + 1) =$$

$$2^{e_1} + m_0 + m_1 + 1$$

As for precision, consider a random binary fixed-point number $r_0$ in normalized form, i.e., with a leading one. Assuming it is neither clipped nor subnormal, quantizing it to $q_0$ with $P_0$ yields $m_0+1$ bits of precision: the leading 1, followed by $m_0$ mantissa bits. Since $q_0$ is obtained via rounding, the first $m_0+2$ bits of $r_1 = r_0 - \text{dequantize}_0(q_0)$ are guaranteed to be zero. Assuming a uniform distribution, the leading one in $r_1$ will be at position $m_0+2+k$ with probability $2^{-k}$, for $k \geq 1$. Summing the infinite series gives an expected location for the leading one of $m_0+4$. Quantizing $r_1$ to $q_1$ with $P_1$ will take this leading one, followed by an additional $m_1$ mantissa bits. Thus, the expected precision of D is $m_0+m_1+4$.

In summary, it should be apparent from the above that techniques provided herein related to multipart encoded representation of numbers improve the tradeoff between simplicity and precision. At-memory or SIMD operations with high-precision operands may be simplified and optimized. The loss of precision or throughput caused by limited-capacity processing elements may be reduced or eliminated. The need to support data types with high bit-lengths is reduced or eliminated. The disclosed combinable data types allow the tailoring of precision to specific implementations.

It should be recognized that features and aspects of the various examples provided above can be combined into further examples that also fall within the scope of the present disclosure. In addition, the figures are not to scale and may have size and shape exaggerated for illustrative purposes.

The invention claimed is:

1. A device comprising:
one or more processors configured to collectively:
quantize a source number as a first binary representation defined by a first set of exponent bits and a first set of mantissa bits to obtain a first encoded part;
compute a difference between the source number and a nearest dequantization of the first encoded part;
quantize the difference as a second binary representation defined by a second set of exponent bits and a second set of mantissa bits to obtain a second encoded part;
store the first encoded part and the second encoded part as an encoded representation of the source number; and
perform a computational operation using the encoded representation.

2. The device of claim 1, wherein:
the first binary representation is further defined by a first exponent bias;
the second binary representation is further defined by a second exponent bias; and
the second exponent bias is selected based on a gap between quantized values of the first binary representation.

3. The device of claim 2, wherein the second exponent bias is selected based on a maximum gap between quantized values of the first binary representation.

4. The device of claim 1, wherein:
the first binary representation is further defined by a first sign bit;
the second binary representation is further defined by a second sign bit that is the same as the first sign bit; and
the difference is computed as a positive remainder.

5. The device of claim 1, wherein:
the first binary representation is further defined by a first sign bit;
the second binary representation is further defined by a second sign bit that is independent of the first sign bit; and
the difference is computed as positive or negative to set the second sign bit.

6. The device of claim 1, wherein the one or more processors comprises:
an array of single-instruction, multiple data (SIMD) processing elements;
wherein each processing element of the array is configured to perform:
a first multiply-accumulate with the first encoded part and a value; and
a second multiply-accumulate with the second encoded part and the value.

7. The device of claim 1, wherein:
the first set of exponent bits and the second set of exponent bits are equal in number.

8. The device of claim 1, wherein:
the first set of mantissa bits and the second set of mantissa bits are equal in number.

9. The device of claim 1, wherein the difference is a first difference and the one or more processors are configured to collectively:
compute a second difference between the first difference and a nearest dequantization of the second encoded part;
quantize the second difference as a third binary representation defined by a third set of exponent bits and a third set of mantissa bits to obtain a third encoded part;
store the first encoded part, the second encoded part, and the third encoded part as an encoded representation of the source number.

10. The device of claim 1, wherein:
the source number is a fixed-point number or a floating-point number; and
the first encoded part and the second encoded part are floating-points numbers, and the first encoded part and the second encoded part represent a quantized fixed-point number or a requantized floating-point number.

11. A device comprising:
one or more processors configured to collectively:
determine a first encoded part of an encoded representation of a source number;
dequantize the first encoded part based on a first binary representation defined by a first set of exponent bits and a first set of mantissa bits to obtain a first decoded part;
determine a second encoded part of the encoded representation of the source number;
dequantize the second encoded part based on a second binary representation defined by a second set of exponent bits and a second set of mantissa bits to obtain a second decoded part; and
add the second decoded part to the first decoded part to obtain a decoded number.

12. The device of claim 11, wherein:
the first binary representation is further defined by a first exponent bias;
the second binary representation is further defined by a second exponent bias; and
the second exponent bias is selected based on a gap between quantized values of the first binary representation.

13. The device of claim 12, wherein the second exponent bias is selected based on a maximum gap between quantized values of the first binary representation.

14. The device of claim 11, wherein:
the encoded representation is unsigned; and
the first decoded part and the second decoded part are positive.

15. The device of claim 11, wherein:
the first binary representation is further defined by a first sign bit;
the second binary representation is further defined by a second sign bit that is independent of the first sign bit; and
the first decoded part and the second decoded part are each positive or negative.

16. The device of claim 11, wherein the one or more processors comprises:
an array of single-instruction, multiple data (SIMD) processing elements;
wherein each processing element of the array is configured to perform:

a first multiply-accumulate with the first encoded part and a value; and a second multiply-accumulate with the second encoded part and the value.

17. The device of claim 11, wherein:

the first set of exponent bits and the second set of exponent bits are equal in number.

18. The device of claim 11, wherein:

the first set of mantissa bits and the second set of mantissa bits are equal in number.

19. The device of claim 11, wherein the one or more processors are configured to collectively:

determine a third encoded part of the encoded representation of the source number;

dequantize the third encoded part based on a third binary representation defined by a third set of exponent bits and a third set of mantissa bits to obtain a third decoded part; and add third encoded part, the second decoded part, and the first decoded part to obtain a decoded number.

20. The device of claim 11, wherein:

the first encoded part and the second encoded part are represented as floating-point numbers; and the decoded number is a fixed-point number.

21. A device comprising:

an array of single-instruction, multiple data (SIMD) processing elements; and a controller connected to the array of processing elements, wherein the controller is configured to:

load a processing element of the array with an encoded representation of a source number, wherein the encoded representation is defined by first exponent and mantissa bits and second exponent and mantissa bits;

control the processing element to perform a computational operation using the encoded representation; and output a result of the computational operation.

22. The device of claim 21, wherein the controller is further configured to:

compute the encoded representation by performing a first quantization on the source number based on the first exponent and mantissa bits and by performing a second quantization on a remainder of the first quantization based on the second exponent and mantissa bits.

23. The device of claim 21, wherein the controller is further configured to:

compute the result as a decoded representation by performing a first dequantization on a first part of the encoded representation based on the first exponent and mantissa bits, performing a second dequantization on a second part of the encoded representation based on the second exponent and mantissa bits, and combining results of the first and second dequantizations.

* * * * *